United States Patent
Wickelmaier et al.

(10) Patent No.: US 6,262,891 B1
(45) Date of Patent: Jul. 17, 2001

(54) COMPONENT HOLDER WITH CIRCULATING AIR COOLING OF ELECTRICAL COMPONENTS

(75) Inventors: Peter Wickelmaier, München; Suavi Örey, Söcking; Peter Enrhart, München, all of (DE)

(73) Assignee: Magnet-Motor Gesellschaft für Magnetmotorische Technik mbH, Starnberg (DE)

( * ) Notice: Subject to any disclaimer, the term of this patent is extended or adjusted under 35 U.S.C. 154(b) by 0 days.

(21) Appl. No.: 09/331,411
(22) PCT Filed: Dec. 19, 1997
(86) PCT No.: PCT/EP97/07207
§ 371 Date: Jun. 21, 1999
§ 102(e) Date: Jun. 21, 1999
(87) PCT Pub. No.: WO98/28961
PCT Pub. Date: Jul. 2, 1998

(30) Foreign Application Priority Data
Dec. 20, 1996 (DE) .............................. 196 53 523

(51) Int. Cl.⁷ ...................................... H05K 7/20
(52) U.S. Cl. ................. 361/695; 165/80.4; 174/15.1; 361/698; 361/699
(58) Field of Search .................. 165/80.4; 174/15.1; 361/687–689, 694–703

(56) References Cited

U.S. PATENT DOCUMENTS

| | | |
|---|---|---|
| 4,246,597 | 1/1981 | Cole et al. . |
| 4,315,300 * | 2/1982 | Parmerlee et al. ................... 361/699 |
| 4,399,484 | 8/1983 | Mayer . |
| 4,498,118 | 2/1985 | Bell . |
| 4,536,824 | 8/1985 | Barrett et al. . |
| 4,646,202 * | 2/1987 | Hook et al. ........................... 361/698 |
| 5,285,347 * | 2/1994 | Fox et al. .............................. 361/699 |
| 5,689,403 * | 11/1997 | Robertson, Jr. et al. ............. 361/695 |

FOREIGN PATENT DOCUMENTS

| | | |
|---|---|---|
| 28 15 646 | 10/1979 | (DE) . |
| 85 10 847 | 7/1985 | (DE) . |
| 35 09 908 A1 | 9/1986 | (DE) . |
| 0 112 994 A2 | 7/1984 | (EP) . |
| 0 356 991 A1 | 3/1990 | (EP) . |
| 0 053 967 | 6/1982 | (FR) . |
| 2 624 684 | 6/1989 | (FR) . |

* cited by examiner

*Primary Examiner*—Gregory Thompson
(74) *Attorney, Agent, or Firm*—Venable; George H. Spencer; Robert Kinberg

(57) ABSTRACT

A component carrier (2) with electric components (4) mounted thereon, having at least one channel (14) for cooling liquid, characterized in that the component carrier (2) has an air cooling body (6), and a fan (8) is associated with the component carrier (2) for producing a forced air stream for air cooling at least part of the components (4) and for air recooling on the air cooling body (6).

19 Claims, 4 Drawing Sheets

COMPONENT HOLDER WITH CIRCULATING AIR COOLING OF ELECTRICAL COMPONENTS

BACKGROUND OF THE INVENTION

This invention relates to a component carrier with electric or electronic components mounted thereon, where the carrier has at least one channel for cooling liquid.

Such component carriers are used as carriers for components of electronic power devices, the cooling liquid flowing in the channel serving to cool the power components. They are offered on the market either as plug-in elements without a package or firmly integrated in a package. Due to the constantly increasing packing density of electronic power devices, the cooling of the power components is an ever greater problem. Furthermore, component carriers with the electric components are frequently used in closed systems, for example to fulfill requirements for EMC tightness and IP requirements. Improved removal of the arising thermal dissipation power is therefore necessary in order to increase the packing density and compactness of electronic power devices.

SUMMARY OF THE INVENTION

It is therefore an object of the present invention to provide a component carrier which improves removal of the thermal dissipation power of electronic components.

This is obtained according to the invention in that the component carrier has an air cooling body, and a fan is associated with the component carrier for producing a forced air stream for air cooling at least a part of the electronic components and for air recooling on the air cooling body. In operation the forced air stream permits optimal cooling of the electronic components which are almost solely dependent on air cooling, e.g. a plurality of capacitors or an internal cabling of the electronic power device. For electronic components mounted, due to their design, on bases cooled by the liquid cooling, an additional air cooling can also be effected via the package walls of the components. The invention thus offers the possibility of combining liquid cooling via the mounting bases of the components with additional air cooling. The air recooling can be effected on an air cooling body cooled by the cooling liquid of the liquid cooling.

The component carrier is preferably composed at least of a carrier plate with the components and the air cooling body. It is particularly preferred for the carrier plate and air cooling body to be interconnected areally and enclose the at least one channel between each other. This results in an especially simple structure and thus facilitation of producing the component carrier. The channel can be easily worked from the surface of one of the plate-like elements before the two are interconnected. Alternatively the component carrier may also be of integral design. For example, the channel can be cast in an integral component carrier.

Further it is preferred for the at least one channel to be provided with an inlet and outlet such that both openings are located on or near one face of the component carrier. This arrangement provides an especially simple possibility of connection for supplying cooling liquid and removing cooling liquid, and the two can be combined on one side of the component carrier. Alternatively it can also be advantageous to provide at least one channel with an inlet and outlet such that the openings are located on or near opposite faces of the component carrier.

It has proved especially favorable to form the air cooling body with cooling ribs or cooling slats. This provides an especially large heat exchange surface, which accordingly contributes to especially great heat exchange in operation. Heat exchange can in addition be promoted by using a material with good heat conductivity for the air cooling body. It is also recommendable to use a material with good heat conductivity for the carrier plate in order to permit good cooling of the mounting bases.

It has also proved particularly preferable to dispose the fan such that in operation the air stream produced by operation of the fan leads away from the fan on one side of the component carrier and leads to the fan on the other side of the component carrier. Circulation can thus take place in a closed circuit. The component carrier itself serves as a partition between the air flowing toward the fan and that flowing away from the fan. The special advantage becomes apparent when the components are all disposed on one side of the component carrier and the air cooling body on the other side. The circulating air cools the components on the first part of its flow path and is recooled by the air cooling body on the other side when flowing back. It can also be advantageous to provide an air cooling body on the side where the components are disposed as well, for example in the vicinity of a component with especially great dissipation power emission. It is also conceivable to dispose air cooling bodies and components jointly on both sides of the component carrier.

It can also be preferred for at least one flow opening to be provided in the component carrier through which at least part of the air stream can flow from one side to the other. Alternatively or in addition to the circulation around the total component carrier, this can form circulation around part of the component carrier. This is preferred in particular when a component carrier flow opening is disposed near a component such that the part of the air stream flowing therethrough can cool it selectively. Depending on the special spatial arrangement of the flow opening through the component carrier and the component on the component carrier one can supply an air stream with a certain temperature to the component very selectively, thereby obtaining especially optimal removal of dissipation power. The cross section and number of the flow openings can be coordinated with the cooling effects to be achieved on the package surfaces of the components. The position of the flow opening is one of the factors determining the temperature of the partial air stream or total air stream. When fixing the geometrical position of the flow openings through the component carrier one preferably adjusts an optimum with respect to temperature, volume throughput and pressure drop of the cooling air.

A guiding element is preferably provided on the component carrier for selectively guiding part of the air stream. This permits the air stream to be guided, for example, selectively onto a component or around a component. Such a guiding element can be a simple plate-like guiding element, for example in the form of a baffle plate. However, it can also be, preferably, a nozzle-like guiding element associated with a flow opening. Such a guiding element, in addition to guiding the air flowing through the flow opening selectively onto a component, accelerates the air flow locally and thus provides especially high local cooling power. For reasons of production technology, among other things, it is particularly preferred to provide a slip-on nozzle-like guiding element which can for example be simply slipped on the flow opening. In general, it is particularly preferred to coordinate the geometrical mounting position of the components on the component carrier, the guidance of the air stream in circulation around the total component carrier and/or part of the component carrier, the arrangement of guiding elements, flow opening, etc., with the dissipation power to be removed and the permissible temperature increase, and design them accordingly. The dissipation power taken up by the component carrier via the component mounting bases with the corresponding temperature conditions is also to be included in such considerations. It can be preferred to provide components cooled via the mounting base which have high dissipation power and require low working temperatures, in the vicinity of the cooling water inlet and to provide components which have high dissipation power but can cope with higher working temperatures, in the vicinity of the cooling water outlet.

A further important factor for design is the flow cross section between the outer limit of the system in operation and the component carrier. The flow cross-section has an essential influence on the speed of the air stream on the air cooling body and the speed and distribution of the air stream near the components. It can be dimensioned so as to obtain an optimum amount of air volume throughput and speed on the components, on the one hand, and recooling on the air cooling body, on the other.

The fan is preferably disposed on one of the faces of the component carrier. This ensures especially simple mounting and especially easy access and moreover leads to especially favorable flow patterns. The fan can be in particular a cross flow fan or, preferably, a radial fan.

Another embodiment of the invention is an electronic device having one of the above-described component carriers disposed in a package such that in operation the air stream is guided between one side of the component carrier and the package wall and between the other side of the component carrier and the package wall. In an electronic device according to the invention two component carriers are preferably provided with a joint fan in a package, the sides with the components or the sides with the air cooling bodies being disposed opposite each other and forming a flow channel for the air stream between each other. The air stream thus flows through a part of the flow path in a joint flow channel, cooling either the components of the two opposite component carriers there or being cooled by the opposite air cooling bodies there, and is then divided on the second part of its flow path to flow back on the corresponding component carrier sides protruding away from each other. The reverse direction of flow can also be preferred. The advantage of this arrangement is that only one joint fan is provided for two component carriers. This permits an even more compact arrangement.

BRIEF DESCRIPTION OF THE DRAWINGS

The invention will be explained in the following detailed description with reference to the accompany Figures, in which.

DETAILED DESCRIPTION OF THE INVENTION

Figure 1:
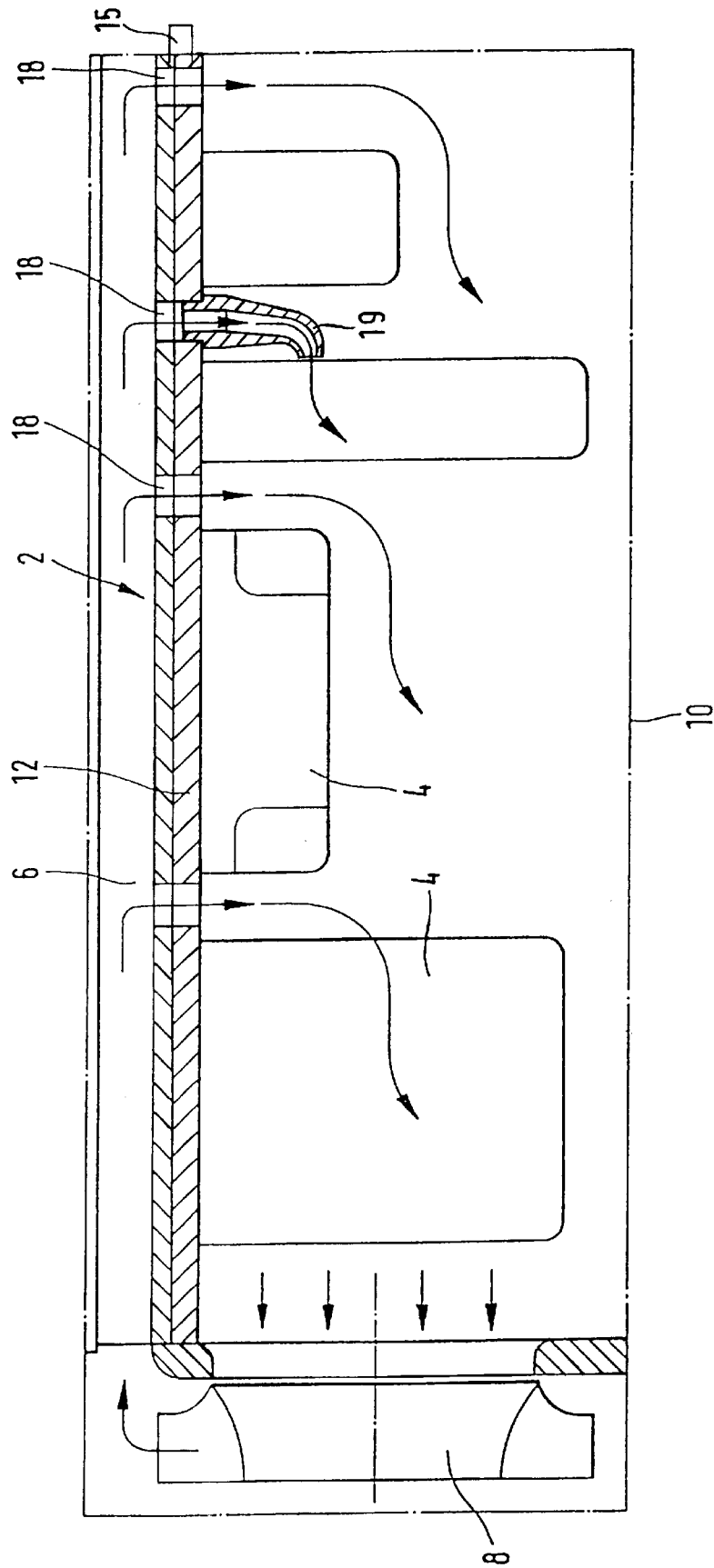
FIG. 1 shows a longitudinal section through an inventive component carrier.

FIG. 1 shows component carrier 2 with electric components 4 mounted thereon, air cooling body 6 and fan 8. Component carrier 2 is disposed in package 10. It is composed of carrier plate 12 on which components 4 are mounted, and air cooling body 6. Carrier plate 12 and air cooling body 6 are substantially plate-shaped elements interconnected areally and enclosing channel 14 between each other which can receive cooling liquid.

Figure 2:
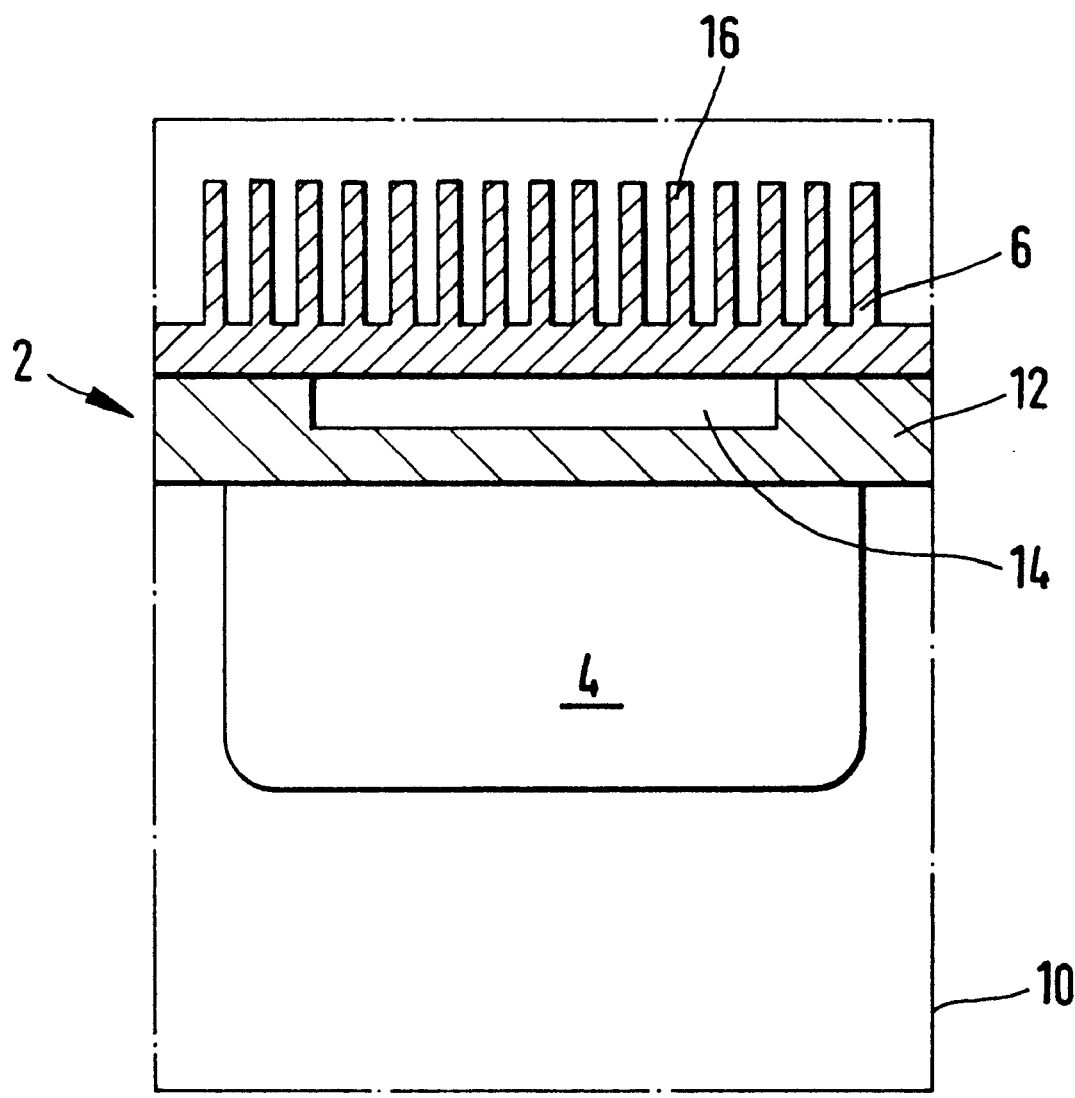
FIG. 2 shows a cross section through another embodiment of the inventive component carrier.

As evident from FIG. 2, the channel is a relatively flat rectangle in cross section and extends substantially over the whole width of component carrier 2. Channel 14 can be worked, e.g. milled, relatively easily from a board element, such as carrier plate 12 or air cooling body 6 before the two plate-shaped elements are interconnected areally. The inlet and outlet for cooling liquid are located on opposite faces of component carrier 2 in the shown embodiment of FIG. 2 and are not shown in FIG. 2. The cooling liquid flowing through channel 14 serves firstly to cool the components fastened to the component carrier via their mounting base area, and further to recool the air circulated by fan 8 on air cooling body 6. This leads to an especially high cooling effect with relatively low effort.

Figure 3:
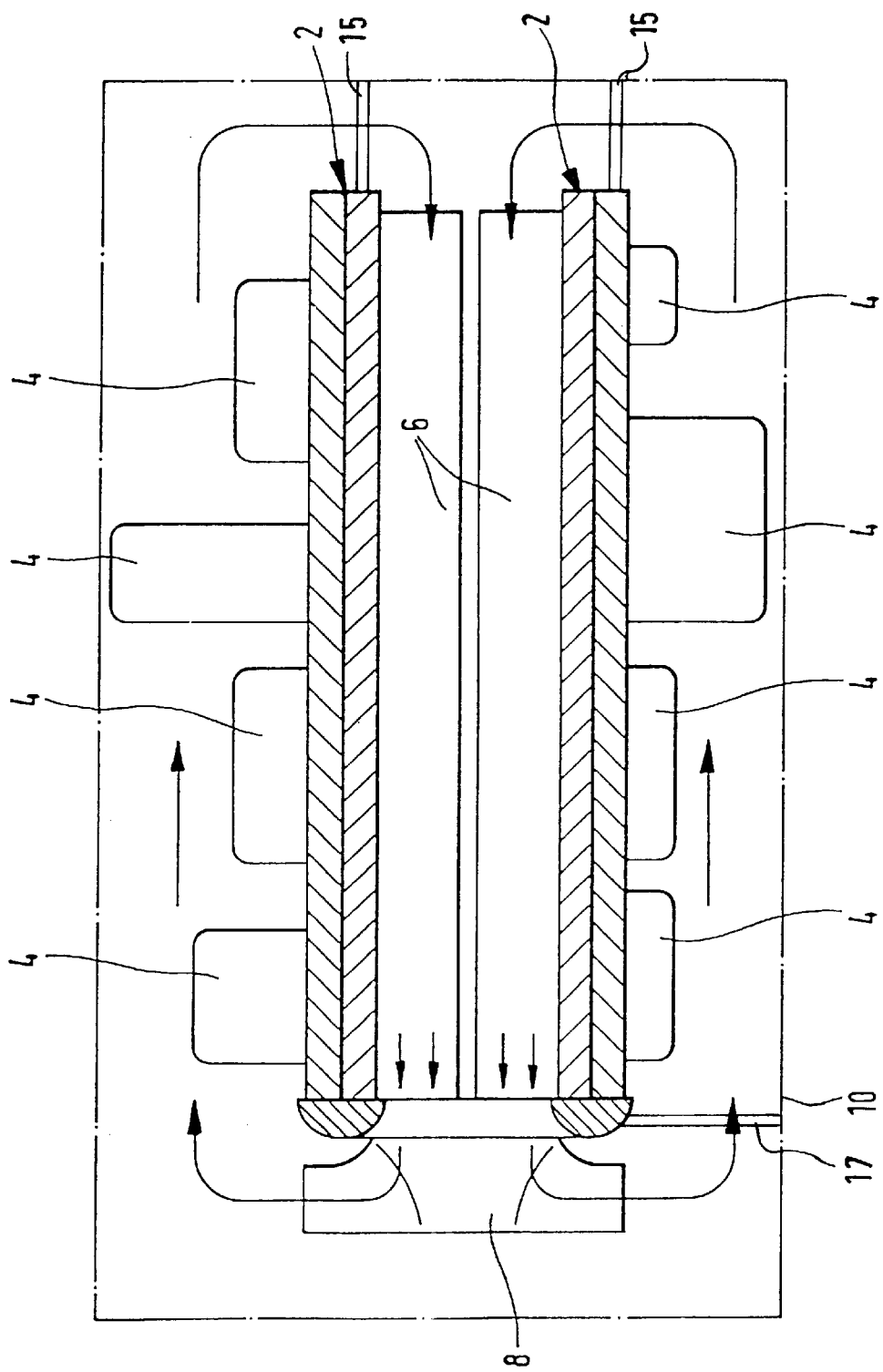
FIG. 3 shows a longitudinal section as in FIG. 1 showing a special kind of arrangement of two component carriers according to the invention.

Inlet and outlet tubes 15, 17 for cooling liquid are shown in FIGS. 1 and 3. In particular, FIG. 1 shows the embodiment where the inlet and outlet 15, 17 are located on the same face of the component carrier 2. The outlet 17 is located "behind" the inlet 15 and is therefore not visible in FIG. 1. FIG. 3 shows an embodiment where the channel 14 is provided with an inlet 15 and outlet 17 located on opposite faces of the component carrier 2.

Air cooling body 6 is preferably made of an especially heat-conducting material and provided with cooling ribs or cooling slats 16 to increase the heat exchange surface in order to achieve maximum heat transfer between the air stream and the cooling liquid.

Fan 8, which is a radial fan to attain a maximum pressure difference, is disposed on one of the faces of component carrier 2 so that the air stream produced thereby leads away therefrom on the upper side of component carrier 2 and leads to fan 8 on the underside of the carrier, as shown by arrows in FIG. 1. When flowing past electronic power components 4, the air stream picks up dissipation power released in the form of heat and emits it to the cooling liquid at air cooling body 6 on the upper side. The air stream flows through a channel formed substantially by package wall 10 and component carrier 2 both on the upper side and on the underside. Viewing FIG. 2, one can see that the air channels are limited by walls of package 10 on the side and the air channel of the upper side is separated from that of the underside by carrier 2 which protrudes far as package 10 on each side.

Through component carrier 2, there are a plurality of flow openings 18 through which part of the air stream can flow from the upper side to the underside. In FIG. 1, one can see that flow openings 18 are disposed so as to be associated with individual components 4 so that the latter are selectively cooled substantially by the part of the air stream flowing through the corresponding flow opening 18. Channel 14 for cooling liquid is, of course, closed off from flow openings 18 and is therefore narrower in the area of flow openings 18 than in the area shown in FIG. 2.

Figure 2A:
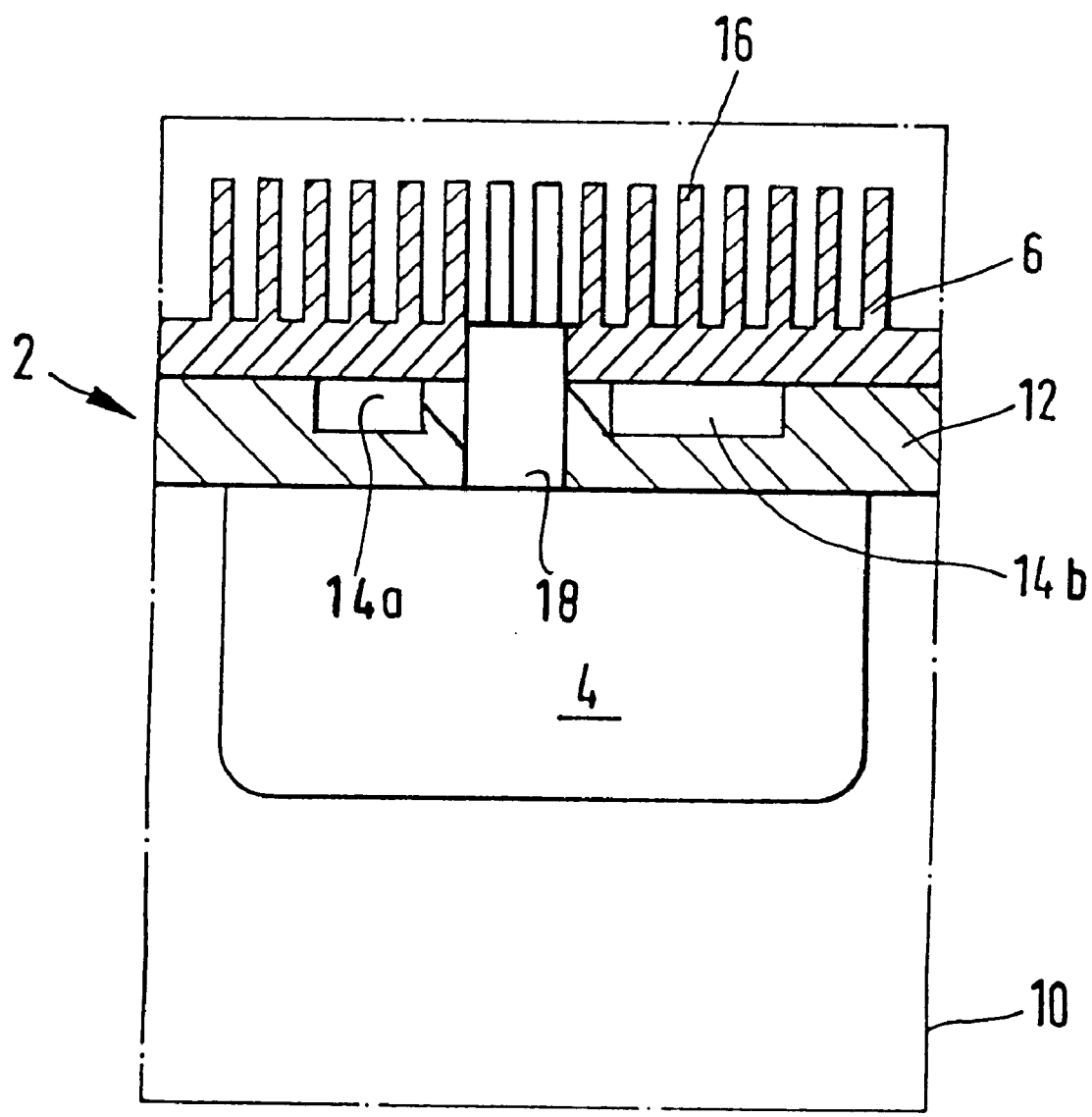
FIG. 2a shows a cross section similar to FIG. 2 where the section is made through one of the flow openings.

As clearly shown in FIG. 2a, channel 14 can be divided into two branches 14a, 14b in the area surrounding flow opening 18. The walls of flow opening 18 close channel 14 from flow opening 18, effectively dividing channel 14 into two branches 14a, 14b. Thus, channel 14 is narrower in the area of the flow openings than an area without a flow opening (FIG. 2). In an alternative embodiment, the flow opening 18 may be located at one side of channel 14 so that its walls reduce the cross-sectional area of channel 14.

As shown in FIG. 1, a guiding element 19 may be provided on the component carrier for selectively guiding part of the air stream. The guiding element is nozzle-like and, preferably, slips onto a flow opening 18.

The view of FIG. 3 shows the arrangement of two component carriers 2 "back to back" with fan 8 in package 10. One can see how air cooling bodies 6 of component carriers 2 are aligned with each other and how the sides of component carriers 2 where components 4 are mounted point away from each other. This forms between component carriers 2 a channel which is sandwiched by air cooling bodies 6 on two sides. Therefore one can use one fan 8 for two component carriers 2 compared to the arrangement shown in FIGS. 1 and 2. Improved cooling power can also result. This permits an even more compact construction. Compared with the above-described embodiment the direction of circulation is reversed in the embodiment of FIG. 3, i.e. the air stream leads from air cooling bodies 6 to fan 8 and away therefrom to components 4. In addition only one closed circulation circuit is shown for each individual component carrier 2 so that the air flows around the faces of component carrier 2 and no flow openings are provided therebetween.

What is claimed is:

1. A component carrier in combination with a package having package walls, said component carrier with at least one electronic component mounted on a side thereof and comprising:

an air cooling body, said air cooling body being located on the component carrier;

at least one channel for receiving cooling liquid; and a fan producing a forced circulated air stream within a volume as enclosed by the package walls, said circulated air stream being guided by said package walls, and said circulated air stream for air cooling at least a part of the at least one electronic component thereby dissipating heat onto the air stream, wherein the at least one channel for receiving cooling liquid recools the heated air stream on the air cooling body.

2. The component carrier of claim 1, wherein the component carrier is composed of at least a carrier plate with the at least one electronic component mounted thereon and the air cooling body.

3. The component carrier of claim 2, wherein the carrier plate and the air cooling body are interconnected areally and enclose the at least one channel for receiving cooling liquid between each other.

4. The component carrier of claim 1, wherein the at least one channel is provided with an inlet and outlet such that both openings are located on or near one face of the component carrier.

5. The component carrier of claim 1, wherein the at least one channel is provided with an inlet and outlet such that the openings are located on or near opposite faces of the component carrier.

6. The component carrier of claim 1, wherein the air cooling body has cooling ribs or cooling slats.

7. The component carrier of claim 1, wherein the component carrier has a component area and a recooling area, the recooling area including the air cooling body and the fan is disposed such that in operation the air stream produced by operation of the fan leads away from the fan on one side of the component carrier drawing air from the recooling area and circulates to the fan on the other side of the component carrier including the component area.

8. The component carrier of claim 1, further comprising at least one flow opening in the carrier plate through which at least part of the air stream can flow from one side to the other side.

9. The component carrier of claim 8, wherein said at least one flow opening of the component carrier is disposed near the at least one electronic component such that the partial air stream flowing therethrough can cool the component selectively.

10. The component carrier of claim 1, further comprising a guiding element for selectively guiding part of the air stream.

11. The component carrier of claim 10, wherein said guiding element is provided for selectively guiding part of the air stream to the at least one electronic component.

12. The component carrier of claim 10, wherein a nozzle-like guiding element is associated with a flow opening.

13. The component carrier of claim 12, wherein a slip-on nozzle-like guiding element is provided that is slipped on the flow opening.

14. The component carrier of claim 1, wherein the fan is disposed on one of the faces of the component carrier.

15. The component carrier of claim 1, wherein the fan is a cross flow fan.

16. The component carrier of claim 1, wherein the fan is a radial fan.

17. An electronic device having the component carrier of claim 1, wherein the component carrier is disposed in the package such that the air stream is guided in operation between one side of the component carrier and one of the package walls and between the other side of the component carrier and another one of the package walls.

18. The electronic device of claim 17, wherein two component carriers are provided with a single fan in a package, at least one of the sides of the carrier components with the electronic components and the sides of the component carriers with the air cooling bodies being disposed opposite each other and forming a flow channel for the air stream between each other so that the single fan circulates an air stream between the two component carriers.

19. A component carrier in combination with a package having package walls, said component carrier with at least one electronic component mounted on a side thereof and comprising:

an air cooling body, said air cooling body being located on the component carrier and having cooling ribs or cooling slats;

at least one channel for receiving cooling liquid; and a fan producing a forced circulated air stream within a volume as enclosed by the package walls, said circulated air stream being guided by said package walls, and said circulated air stream for air cooling at least a part of the at least one electronic component thereby dissipating heat onto the air stream, wherein the at least one channel for receiving cooling liquid recools the heated air stream on the air cooling body.

* * * * *